(12) United States Patent
Rueckes et al.

(10) Patent No.: US 7,113,426 B2
(45) Date of Patent: *Sep. 26, 2006

(54) NON-VOLATILE RAM CELL AND ARRAY USING NANOTUBE SWITCH POSITION FOR INFORMATION STATE

(75) Inventors: Thomas Rueckes, Boston, MA (US); Brent M. Segal, Woburn, MA (US); Bernard Vogeli, Boston, MA (US); Darren Brock, Elmsford, NY (US); Venkatachalam C. Jaiprakash, Fremont, CA (US); Claude L. Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 123 days.

This patent is subject to a terminal disclaimer.

(21) Appl. No.: 10/810,963

(22) Filed: Mar. 26, 2004

(65) Prior Publication Data
US 2005/0041466 A1 Feb. 24, 2005

Related U.S. Application Data

(60) Provisional application No. 60/459,222, filed on Mar. 28, 2003.

(51) Int. Cl.
G11C 11/34 (2006.01)
G11C 11/00 (2006.01)

(52) U.S. Cl. .................. 365/185.01; 365/177; 365/163

(58) Field of Classification Search ............ 365/185.01, 365/177, 163, 153, 101, 151; 257/415; 977/DIG. 1
See application file for complete search history.

(56) References Cited

U.S. PATENT DOCUMENTS

| 3,448,302 | A | 6/1969 | Shanfield |
| 4,845,533 | A | 7/1989 | Pryor et al. |
| 4,876,667 | A | 10/1989 | Ross et al. |
| 6,044,008 | A | 3/2000 | Choi |
| 6,128,214 | A | 10/2000 | Kuekes et al. |
| 6,159,620 | A | 12/2000 | Heath et al. |
| 6,183,714 | B1 | 2/2001 | Smalley et al. |
| 6,198,655 | B1 | 3/2001 | Heath et al. |
| 6,221,330 | B1 | 4/2001 | Moy et al. |
| 6,232,706 | B1 | 5/2001 | Dai et al. |
| 6,445,006 | B1 | 9/2002 | Brandes et al. |
| 6,518,156 | B1 | 2/2003 | Chen et al. |
| 6,548,841 | B1 * | 4/2003 | Frazier et al. ............ 257/254 |
| 6,559,468 | B1 | 5/2003 | Kuekes et al. |
| 6,574,130 | B1 | 6/2003 | Segal et al. |
| 6,643,165 | B1 * | 11/2003 | Segal et al. ................. 365/151 |
| 6,673,424 | B1 | 1/2004 | Lindsay et al. |
| 6,706,402 | B1 | 3/2004 | Rueckes et al. |
| 6,750,471 | B1 | 6/2004 | Bethune et al. |
| 6,759,693 | B1 | 7/2004 | Vogeli et al. |
| 6,774,052 | B1 | 8/2004 | Vogeli et al. |
| 6,781,166 | B1 * | 8/2004 | Lieber et al. ............... 257/211 |
| 6,784,028 | B1 | 8/2004 | Rueckes et al. |
| 6,803,840 | B1 | 10/2004 | Hunt et al. |
| 6,809,465 | B1 | 10/2004 | Jin |
| 2002/0130311 | A1 | 9/2002 | Lieber et al. |
| 2002/0130353 | A1 | 9/2002 | Lieber et al. |
| 2002/0172963 | A1 | 11/2002 | Kelley et al. |
| 2002/0179434 | A1 | 12/2002 | Dai et al. |
| 2003/0021966 | A1 | 1/2003 | Segal et al. |
| 2003/0042834 | A1 * | 3/2003 | Dean et al. ................. 313/309 |
| 2003/0124325 | A1 | 7/2003 | Rueckes et al. |
| 2003/0165074 | A1 | 9/2003 | Segal et al. |
| 2003/0234407 | A1 | 12/2003 | Vogeli et al. |
| 2003/0236000 | A1 | 12/2003 | Vogeli et al. |
| 2004/0085805 | A1 | 5/2004 | Segal et al. |
| 2004/0159833 | A1 | 8/2004 | Rueckes et al. |
| 2004/0164289 | A1 | 8/2004 | Rueckes et al. |
| 2004/0175856 | A1 | 9/2004 | Jaiprakash et al. |
| 2004/0181630 | A1 | 9/2004 | Jaiprakash et al. |
| 2004/0191978 | A1 | 9/2004 | Rueckes et al. |
| 2004/0214366 | A1 | 10/2004 | Segal et al. |
| 2004/0214367 | A1 | 10/2004 | Segal et al. |
| 2005/0041465 | A1 | 2/2005 | Rueckes et al. |
| 2005/0047244 | A1 | 3/2005 | Rueckes et al. |
| 2005/0056877 | A1 | 3/2005 | Rueckes et al. |

FOREIGN PATENT DOCUMENTS

WO WO 01/03208 A1 1/2001

OFF STATE

ON STATE

| WO | WO 01/44796 A1 | 6/2001 |
| --- | --- | --- |
| WO | WO 04/065657 A1 | 8/2004 |

OTHER PUBLICATIONS

Choi, W. B. et al., "Carbon-nanotube-based nonvolatile memory with oxide-nitride-film and nanoscale channel." *Appl. Phys. Lett.*, 2003, vol. 82(2) 275-277.

Dequesnes, M. et al., "Calculation of pull-in voltages for carbon-nanotube-based nanoelectromechanical switches." *Nanotechnology*, 2002, vol. 13, 120-131.

Dequesnes, M. et al., "Simulation of carbon nanotube-based nanoelectromechanical switches." *Computational Nanoscience and Nanotechnology*, 2002, 383-386.

Wolf, S., Silicon Processing for the VLSI Era; vol. 2—Process Integration, Multi-Level-Interconnect Technology for VLSI and ULSI, 1990, Section 4.3 Materials for Multilevel Interconnect Technologies, pp. 189-191, Lattice Press, Sunset Beach.

Wolf, S., Silicon Processing for the VLSI Era; vol. 2—Process Integration, 1990, Section 4.7 Manufacturing Yield and Reliability Issues of VLSI Interconnects, pp. 260-273, Lattice Press, Sunset Beach.

Robinson, L.A.W., "Self-Aligned Electrodes for Suspended Carbon Nanotube Structures." *Microelectronic Engineering*, 2003, vols. 67-68. 615-622.

Tour, J. M. et al., "NanoCell Electronic Memories." *J. Am. Chem Soc.*, 2003, vol. 125, 13279-13283.

Rueckes, T., et al., "Carbon Nanotube-Based Nonvolatile Random Access Memory for Molecular Computing" *Science*, 2000, vol. 289, 94-97.

Fan, S. et al., "Carbon nanotube arrays on silicon substrates and their possible application." *Physica E*, 2000, vol. 8, 179-183.

Zhan, W. et al., "Microelectrochemical Logic Circuits." *J. Am. Chem. Soc.*, 2003, vol. 125, 9934-9935.

Soh, H. T. et al., "Integrated nanotube circuits: Controlled growth and ohmic contacting of single-walled carbon nanotubes." *Appl. Phys. Lett.*, 1999, vol. 75(5) 627-629.

Kinaret, J.M. et al., "A carbon-nanotube-based nanorelay", *Appl. Phys. Lett.*, 2003, vol. 82(8) 1287-1289.

Franklin, N. R. et al., "Integration of suspended carbon nanotube arrays into electronic devices and electromechanical systems." *Appl. Phys. Lett.*, 2002, vol. 81(5) 913-915.

Avouris, P., "Carbon nanotube electronics," Chem. Physics, 2002, vol. 281, pp. 429-445.

Dai, H. et al., "Controlled Chemical Routes to Nanotube Architectures, Physics, and Devices." *J. Phys. Chem . B*, 1999, vol. 103, 111246-11255.

Homma, Y. et al., "Growth of Suspended Carbon Nanotubes Networks on 100-nm-scale Silicon Pillars." *Appl. Phys. Lett.*, 2002, vol. 81(12) 2261-2263.

Ajayan, P.M., et al., "Nanometre-size tubes of carbon." *Rep. Prog. Phys.*, 1997, vol. 60, 1025-1062.

Sreekumar, T.V., et al., "Single-wall Carbon Nanotube Films", *Chem. Mater. 2003*, vol. 15, 175-178.

Verissimo-Alves, M. et al., "Electromechanical effects in carbon nanotubes: *Ab initio* and analytical tight-binding calculations." *Phys. Rev. B*, 2003, vol. 67, 161401-1-161401-4.

Fuhrer, M.S. et al., "High-Mobility Nanotube Transistor Memory." *Nano Letters*, 2002, vol. 2(7) 755-759.

Radosavljevic, M. et al., "Nonvolatile molecular memory elements based on ambipolar nanotube field effect transistors." *Nano Letters*, 2002, vol. 2(7) 761-764.

Farajian, A. A. et al., "Electronic transport through bent carbon nanotubes: Nanoelectromechanical sensors and switches." *Phys. Rev. B*, 200,. vol. 67, 205423-1-205423-6.

Fischer, J.E. et al., "Magnetically aligned single wall carbon nanotube films: Preferred orientation and anisotropic transport properties." *Journal of Appl. Phys.*, 2003, vol. 93(4) 2157-2163.

Lee, K.H. et al., "Control of growth orientation for carbon nanotubes." *Appl. Phys. Lett.*, 2003, 82 (3) 448-450.

Casavant, M.J. et al., "Neat macroscopic membranes of aligned carbon nanotubes." *Journal of Appl. Phys.*, 2003, vol. 93(4) 2153-2156.

Ami, S. et al., "Logic gates and memory cells based on single $C_{60}$ electromechanical transistors." *Nanotechnology*, 2001, vol. 12, 44-52.

Dehon, A., "Array-Based Architecture for FET-Based, Nanoscale Electronics." *IEEE Transactions on Nanotechnology*, 2003, vol. 2(1) 23-32.

Tans, S. et al., "Room-temperature transistor based on a single carbon nanotube," *Nature*, 1998, vol. 393, 49-52.

Cui, J.B. et al., "Carbon Nanotube Memory Devices of High Charge Storage Stability." *Appl. Phys. Lett.*, 2002, vol. 81(17) 3260-3262.

\* cited by examiner

*Primary Examiner*—Tuan T. Nguyen
*Assistant Examiner*—Dang Nguyen
(74) *Attorney, Agent, or Firm*—Wilmer Cutler Pickering Hale and Dorr LLP

(57) ABSTRACT

Non-Volatile RAM Cell and Array using Nanotube Switch Position for Information State. A non-volatile memory array includes a plurality of memory cells, each cell receiving a bit line, word line, and release line. Each memory cell includes a cell selection transistor with first, second and third nodes. The first and second nodes are in respective electrical communication with the bit line and the word line. Each cell further includes an electromechanically deflectable switch, having a first, second and third node. The first node is in electrical communication with the release line, and a third node is in electrical communication with the third node of the cell selection transistor. The electromechanically deflectable switch includes a nanotube switching element physically positioned between the first and third nodes of the switch and in electrical communication with the second node of the switch. The second node of the switch is in communication with a reference signal. Each nanotube switching element is deflectable into contact with the third node of the switch in response to signals at the first and second node of the cell selection transistor and is releasable from such contact in response to a signal at the release line. In preferred embodiments, the cell selection transistor is a FET and the second node of the transistor is a gate of the FET.

12 Claims, 2 Drawing Sheets

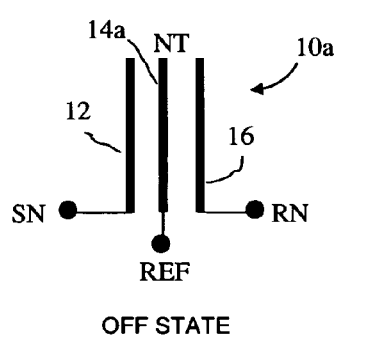
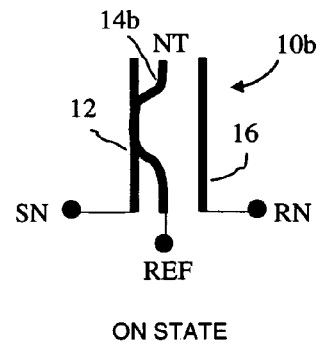
FIG. 1a
FIG. 1b
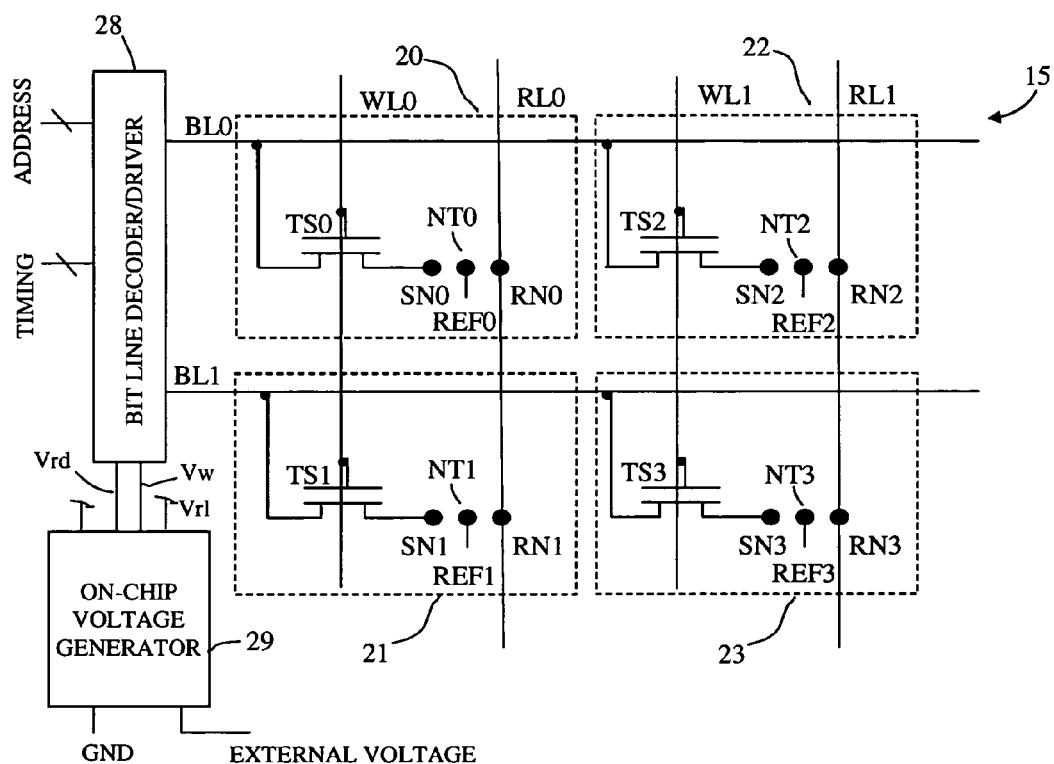
FIG. 2

NON-VOLATILE RAM CELL AND ARRAY USING NANOTUBE SWITCH POSITION FOR INFORMATION STATE

CROSS-REFERENCE TO RELATED APPLICATIONS

This application claims priority under 35 U.S.C. §119(e) to U.S. Provisional Pat. Apl., Ser. No. 60/459,222, filed on Mar. 28, 2003, entitled *NRAM Byte/Block Released Bit Selectable One-Device Nanotube Array*, which is incorporated herein by reference in its entirety.

This application is related to the following U.S. applications, the contents of which are incorporated herein in their entirety by reference:

U.S. Provisional Apl. Ser. No. 60/459,223 filed on Mar. 28, 2003, entitled *NRAM Bit Selectable Two-Device Nanotube Array*; and U.S. Pat. Apl., Ser. No. (inserted upon USPTO designation), filed on the same day as the present application, entitled *NRAM Bit Selectable Two-Device Nanotube Array*.

U.S. Provisional Patent Application No. 60/459,253, filed on Mar. 28, 2003, entitled Single Transistor with Integrated Nanotube (NT-FET); and U.S. Pat. Apl, Ser. No. (inserted upon USPTO designation), filed on the same day as the present application, entitled A Four Terminal Non-Volatile Transistor Device.

U.S. Provisional Patent Application No. 60/459,224, filed on Mar. 28, 2003, entitled Nanotube-on-Gate FET Structures and Applications; and U.S. Pat. Apl, Ser. No. (inserted upon USPTO designation), filed on the same day as the present application, entitled Nanotube-on-Gate FET Structures and Applications.

TECHNICAL FIELD

The invention relates to non-volatile RAM structures and more specifically to non-volatile structures using nanotube electromechanical (NT) switches to provide unit cells that may be employed in integrated circuits.

BACKGROUND OF THE INVENTION

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; 5,198,994.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and reliability and has not reached a state of commercialization. See U.S. Pat. Nos. 3,448,302; 4,845,533; 4,876,667; 6,044,008.

Wire crossbar memory (MWCM) has also been proposed. See U.S. Pat. Nos. 6,128,214; 6,159,620; 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul., 2000. Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals to date rely on directed growth or chemical self-assembly techniques to grow the individual nanotubes needed for the memory cells. These techniques are now believed to be difficult to employ at commercial scales using modem technology. Moreover, they may contain inherent limitations such as the length of the nanotubes that may be grown reliably using these techniques, and it may difficult to control the statistical variance of geometries of nanotube wires so grown.

The ideal memory for at least some purposes is one which would offer low cost per bit, high density, fast random access, read/write cycle times of equal duration, low power consumption, operation over a wide temperature range, a single low-voltage power supply, with a high degree of radiation tolerance. The non-volatile described herein cell offers high speed read, but also high speed write (nanosecond) vs. the slow (microsecond & millisecond) write time of EEPROM and FLASH EEPROM type of memories. The memory is much denser than conventional SRAM because it has a two device, NT and 3 array line structure, and offers competitive performance. The density is less than that of DRAM cells, however, the product offers NDRO operation and non-volatility.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. Patent Application Publication No. 2003-0021966, a nanofabric may be patterned into ribbons, and the ribbons can be used as components to create non-volatile electromechanical memory cells. The ribbon is electromechanically-deflectable in response to electrical stimulus of control traces and/or the ribbon. The deflected physical state of the ribbon may be made to represent a corresponding information state. The deflected physical state has non-volatile properties, meaning the ribbon retains its physical (and therefore informational) state even if power to the memory cell is removed. As explained in U.S. Patent Application Publication No. 2003-0124325, three-trace architectures may be used for electromechanical memory cells, in which the two of the traces are electrodes to control the deflection of the ribbon.

SUMMARY OF THE INVENTION

The invention provides non-volatile RAM cell and array using nanotube switch position for information state.

According to one aspect of the invention, a non-volatile memory array includes a plurality of memory cells, each cell receiving a bit line, word line, and release line. Each memory cell includes a cell selection circuit with first, second and third nodes, the first and second nodes are in respective electrical communication with the bit line and the word line. Each cell further includes an electromechanical switch having a nanotube switching element that is electromechanically deflectable into and out of contact with the third node of the cell selection circuit, said nanotube switching element being in electrical communication with a reference signal.

According to another aspect of the invention, a non-volatile memory array includes a plurality of memory cells, each cell receiving a bit line, word line, and release line. Each memory cell includes a cell selection transistor with first, second and third nodes. The first and second nodes are in respective electrical communication with the bit line and the word line. Each cell further includes an electromechanically deflectable switch, having a first, second and third node. The first node is in electrical communication with the release line, and a third node is in electrical communication with the third node of the cell selection transistor. The electromechanically deflectable switch includes a nanotube switching element physically positioned between the first and third nodes of the switch and in electrical communication with the second node of the switch. The second node of the switch is in communication with a reference signal. Each nanotube switching element is deflectable into contact with the third node of the switch in response to signals at the first and second node of the cell selection transistor and is releasable from such contact in response to a signal at the release line.

According to another aspect of the invention, the cell selection transistor is a FET and the second node of the transistor is a gate of the FET.

According to another aspect of the invention, the nanotube switching element is a ribbon of nanotube fabric.

According to another aspect of the invention, each ribbon of nanotube fabric includes a plurality of carbon nanotubes.

According to another aspect of the invention, the nanotube fabric is porous.

According to another aspect of the invention, the nanotube fabric is substantially a monolayer of carbon nanotubes.

According to another aspect of the invention, the nanotube fabric is formed of single-walled carbon nanotubes.

According to another aspect of the invention, informational state of a memory cell is manifested by the position of the nanotube switching element and wherein the position of the nanotube switching element is sensed on the bit line as a time variation of the bit line signal.

According to another aspect of the invention, the release line is shared among a plurality of memory cells and wherein activation of the release line causes all nanotube switching elements of the plurality of memory cells sharing the release line to release from contact with a corresponding third node of the switch.

BRIEF DESCRIPTION OF THE DRAWINGS

The foregoing and other objects of this invention, the various features thereof, as well as the invention itself, may be more fully understood from the following description when read together with the accompanying drawings in which:

FIG. 1a is a representation of NT structure in the OFF state;

FIG. 1b is a representation of NT structure in the ON state;

FIG. 2 is an illustration of a memory array with each cell comprising a select FET and an NT structure.

DESCRIPTION OF THE PREFERRED EMBODIMENTS

Figure 3:
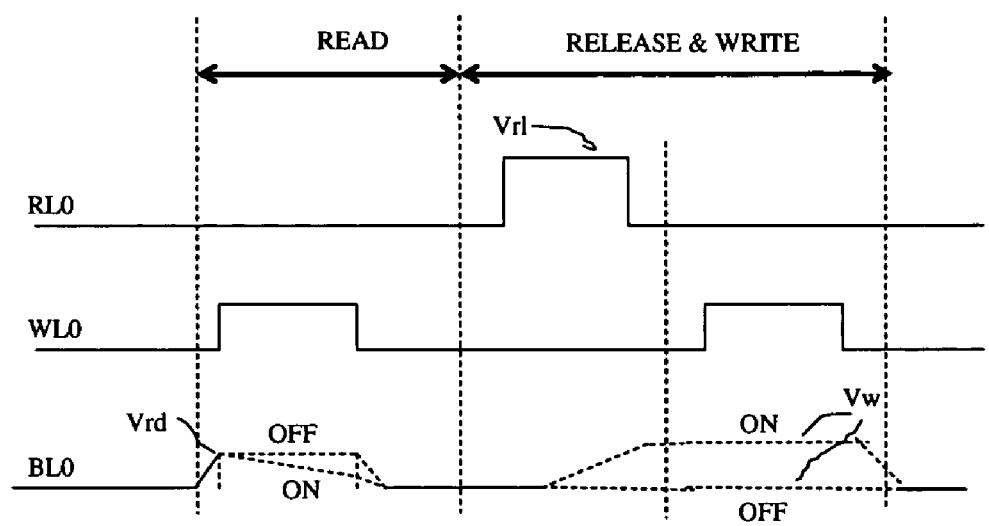
FIG. 3 is an illustration of the operational waveforms of a memory array with each cell comprising a select FET and an NT structure.

One embodiment of an NT switching component includes NFET or PFET devices, particularly NFET array devices in combination with nanotube (NT) electromechanical switching components to provide unit cells that may be employed in integrated circuits. The NT switching component has two states: an "ON" state and an "OFF" state. As shown in FIG. 1a, the OFF state 10a has an un-deflected NT 14a, resulting in an open circuit (i.e., high impedance in the range of one or more mega-ohms) between NT 14a and select electrode 12 connected to terminal SN, and release electrode 16 connected to node RN. Alternatively, the "OFF" state may have a deflected NT in contact with an insulating layer on node RN (not shown). In this OFF state, a small parasitic capacitance exists between NT 14a and select electrode 12 and release electrode 16. In the ON state 10b as shown in FIG. 1b, NT 14b is flexed and held in close proximity to a select node (electrode) by van der Waal forces, resulting in an ohmic resistance typically in the 1,000 to 100,000 ohm range between NT 14b and select node 12.

The NT switching component toggles from OFF to ON (near-ohmic) state when a select voltage (typically in the range of 0.25 to 2 volt) is applied between a select electrode SN and a reference electrode REF connected to the NT. The OFF state is restored when a restore voltage, typically in the range of 0.5 to 5 volts, is applied between a restore node RN and a NT maintains its current state even after removing the electrical power. NT electrical characteristics are described in Thomas Rueckes et al., "Carbon Nanotube-Based Non-volatile Random Access Memory for Molecular Computing," Science, vol. 289, pp. 94–97, 7 Jul., 2000.

In one embodiment, an NT switching component forms a non-volatile storage cell when integrated with an NFET transistor in a memory array system as illustrated in FIG. 2. The memory array 15 includes a matrix of non-volatile storage cells 20 through 23. Memory array 15 also includes read and write word lines (WL0, WL1, etc.), release lines (RL0, RL1, etc.), and read and write bit lines (BL0, BL1, etc.). A word line generator (not shown) provides word line signals to the memory cells. A release line generator (not shown) provides release line signals to the memory cells. A bit line generator provides bit line signals to the memory cells.

The bit line generator includes a bit line decoder/driver 28 and an on-chip voltage generator 29. The decoder/driver 28 is used to select bit lines to be activated. The bit lines are selected based on the address inputs and timing inputs. The on-chip voltage generator 29 generates the applied bit line voltage levels. Vrd is the read voltage, and Vw is the write voltage. The Release Line Decoder/Driver (not shown) is used to select release lines to be activated. The On-Chip Voltage Generator 29 generates the applied release line voltage level Vrl. Non-volatile cell 20, as with all the other cells of the present invention, comprises select transistor TS0, and the nanotube structure comprising nanotube NT0, select node SN0, and release node RN0. The gate of TS0 is coupled to WL0, the drain of TS0 is coupled to BL0, the source of TS0 is coupled to select node SN0. NT0 is coupled to REF0 (typically ground). Release node RN0 is connected to Release Line RL0 of cell 20, which is also connected to RN1 of cell 21 (and may also be connected to release nodes in other cells, not shown).

For a write operation (to cell 20, as an example), an RL0 release voltage value Vrl is first applied directly to node RN0 to ensure that the nanotube structure is in the OFF state (FIG. 1a). That is, RL0 activates release node RN0. Transistor TS0 is then activated by WL0, and the voltage Vw of BL0 is applied through the resulting conductive channel of transistor TS0 to select node SN0. The applied voltage Vw between nodes SN0 and REF0 (ground) will force the nanotube structure to the ON or logic "1" state (FIG. 1b). The near-ohmic connection between SN0 and REF0 represents the ON state. If the applied voltage Vw is at or near zero, the cell remains in the OFF state.

For an exemplary read operation (from cell 20, as an example), BL0 is driven high and allowed to float. WL0 is driven to a high voltage and transistor TS0 turns on, so that the conductive channel of transistor TS0 connects BL0 to select node SN0. If cell 20 is in the ON state (FIG. 1b), a conductive path exists between SN0 and REF0 (ground), and the high bit line voltage decreases as the bit line discharges through TS0, to SN0 and to REF0 (ground). If, however, cell 20 is in the OFF state (FIG. 1a), then the TS0 channel to SN0 presents a high impedance path (high mega ohm or gig ohm) from BL0 to SN0 and REF0 (ground), and bit line voltage Vrd will not discharge and will remain unchanged. In a typical memory cell the impedance of the "OFF" state is at least ten times larger than the impedance of the "ON" state. The sense amplifier/latch circuit (not shown) detects changes in BL0 voltage. If the voltage Vrd on BL0 has decreased (i.e., if the sense amplifier/latch circuit detects that the voltage Vrd has decayed to below a predetermined threshold value), the latch is set to a logic "1" state. If the voltage Vrd is unchanged, then the latch is set to a logic "0" state. The read operation is therefore a nondestructive read out (NDRO) of the cell information. No write back/regeneration cycle is necessary. Also, if external power is lost, the array preserves the stored information (i.e., nonvolatile storage). The actual value of the predetermined threshold depends upon specific parameters of the cell 20, and may be determined either empirically or analytically through techniques known in the art.

FIG. 3 illustrates the operational waveforms of the circuit shown in FIG. 2 during the read and during the release and write operations for cell 20. During the read operation, cell 20 is selected by charging BL0 to a read voltage Vrd in the 0.5 to 1 volt range, and driving WL0 to a high level sufficient to turn the transistor on. If the cell is in the OFF (logic "0") state (FIG. 1a), Vrd remains unchanged. If the cell is in the ON (logic "1") state (FIG. 1b), the voltage Vrd decreases. The difference in BL0 voltage Vrd between ON and OFF states is typically about 200 mV, although this value may vary depending upon the particular characteristics of the circuit. The sense amplifier/latch circuit (not shown) determines whether or not the BL0 voltage changed, and latches a value corresponding to that determination as described herein.

A release operation precedes a write operation. During release, cell 20 is selected when RL0, electrically connected to RN0, is driven to voltage Vrl, typically in a range of 1 to 5 volts. This drives cell 20 to the OFF state (FIG. 1a). RL0 is also connected to RN1 in cell 21, and is consequently also driven to the OFF state (FIG. 1a). Any other cells (not shown in FIG. 2) with release nodes directly connected to RL0 will likewise be driven to the OFF state. At the start of the write cycle, cell 20 in the OFF state (FIG. 1a) because of the preceding release operation. Cell 20 is selected when BL0 is driven to voltage Vw, which is typically in the 0.5 to 2 volt range for writing a logical "1" state (cell is ON) and WL0 is driven to a high state. If BL0 voltage is zero when WL0 is driven to a high state, the cell remains in the OFF or logical "0" state.

The NT electromechanical switching components in the described embodiments incorporate a nanofabric component. In at least some cases, the technique chosen to create a nanofabric must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bi-layers or tri-layers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs). The nanofabric is patterned using photolithographic techniques generating an electrically conductive trace of nanotubes.

The following U.S. Patent applications disclose various methods and techniques for making nanotube fabrics and nanotube switching elements that may be used as NT devices of preferred embodiments. The nanotube fabrics are porous and in some instances highly porous. The nanotube fabrics are substantially a monolayer of carbon nanotubes. In certain preferred embodiments, the carbon nanotubes are single-walled carbon nanotubes. Their disclosures are hereby incorporated by reference in their entirety:

"Electromechanical Memory Array Using Nanotube Ribbons and Method for Making Same," U.S. patent application Ser. No. 09/915093, filed Jul. 25, 2001 (NAN-1);

"Electromechanical Three-Trace Junction Devices," U.S. patent application Ser. No. 10/033323, filed Dec. 28, 2001 (NAN-4);

"Nanotube Films And Articles," U.S. patent application Ser. No. 10/128118, filed Apr. 23, 2002 (NAN-6);

"Methods Of Making Carbon Nanotube Films, Layers, Fabrics, Ribbons, Elements And Articles," U.S. patent application Ser. No. 10/341005, filed Jan. 13, 2003 (NAN-15);

"Devices Having Horizontally-Disposed Nanofabric Articles And Methods Of Making The Same," U.S. patent application Ser. No. 10/776,059, filed Feb. 11, 2004 (NAN-19); and "Devices Having Vertically-Disposed Nanofabric Articles And Methods Of Making "The Same," U.S. patent application Ser. No. 10/776,572, filed Feb. 11, 2004 (NAN-20).

Other embodiments may employ double-walled nanotubes, including such nanotubes with metallic properties.

The preferred embodiment uses electrostatic attractive forces to deflect the nanotube element, but other embodiments may use repulsive forces.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A non-volatile memory array, comprising:
  a plurality of memory cells, each cell receiving a bit line, word line, and release line;
  each memory cell including a cell selection transistor with first, second and third nodes, the first and second nodes being in respective electrical communication with the bit line and the word line,
  each cell further including an electromechanically deflectable switch, having a first, second and third node, the first node being in electrical communication with the release line, and a third node being in electrical communication with the third node of the cell selection transistor, the electromechanically deflectable switch including a nanotube switching element physically positioned between the first and third nodes of the switch and in electrical communication with the second node of the switch and wherein the second node of the switch is in communication with a reference signal;
  wherein each nanotube switching element is deflectable into contact with the third node of the switch in response to signals at the first and second nodes of the cell selection transistor and is releasable from such contact in response to a signal at the release line.

2. The memory array according to claim 1, wherein the cell selection transistor is a FET and the second node of the transistor is a gate of the FET.

3. The memory array according to claim 1, wherein the nanotube switching element is a ribbon of nanotube fabric.

4. The memory array according to claim 3, wherein each ribbon of nanotube fabric includes a plurality of carbon nanotubes.

5. The memory array of claim 3 wherein the nanotube fabric is porous.

6. The memory array of claim 3 wherein the nanotube fabric is substantially a monolayer of carbon nanotubes.

7. The memory array of claim 3 wherein the nanotube fabric is formed of single-walled carbon nanotubes.

8. The memory array of claim 1 wherein informational state of a memory cell is manifested by the position of the nanotube switching element and wherein the position of the nanotube switching element is sensed on the bit line as a time variation of the bit line signal.

9. The memory array of claim 1 wherein the release line is shared among a plurality of memory cells and wherein activation of the release line causes all nanotube switching elements of the plurality of memory cells sharing the release line to release from contact with a corresponding third node of the switch.

10. The memory array according to claim 2, wherein the FET is an NFET.

11. The memory array according to claim 2, wherein the FET is a PFET.

12. A non-volatile memory array, comprising:
  a plurality of memory cells, each cell receiving a bit line, word line, and release line;
  each memory cell including a cell selection circuit with first, second and third nodes, the first and second nodes being in respective electrical communication with the bit line and the word line,
  each cell further including an electromechanical switch, having a nanotube switching element that is electromechanically deflectable into and out of contact with the third node of the cell selection circuit, said nanotube switching element being in electrical communication with a reference signal.

* * * * *